United States Patent [19]

Blowers

[11] Patent Number: 4,580,127

[45] Date of Patent: Apr. 1, 1986

[54] CIRCUIT FOR CONVERTING ANALOG BIPOLAR SIGNALS TO DIGITAL SIGNALS

[75] Inventor: Michael G. Blowers, Otsego, Mich.

[73] Assignee: Jet Electronics & Technology Inc., Grand Rapids, Mich.

[21] Appl. No.: 479,459

[22] Filed: Mar. 28, 1983

[51] Int. Cl.$^4$ .............................................. A03M 1/12
[52] U.S. Cl. ........................ 340/347 AD; 340/52 R; 73/116
[58] Field of Search ................... 340/347 AD, 52 R; 73/116

[56] References Cited

U.S. PATENT DOCUMENTS

| | | | |
|---|---|---|---|
| 3,237,448 | 3/1966 | Howell et al. | 73/116 |
| 3,250,901 | 5/1966 | Brahm | 73/117.2 |
| 3,309,678 | 3/1967 | Sargent et al. | 340/172.5 |
| 3,357,239 | 12/1967 | Hohenberg | 73/116 |
| 3,362,217 | 1/1968 | Evans et al. | 73/116 |
| 3,387,120 | 6/1968 | Funk et al. | 235/150.2 |
| 3,482,440 | 12/1969 | Curwen | 73/116 |
| 3,499,323 | 3/1970 | Sturges | 73/116 |
| 3,527,086 | 9/1970 | Evans et al. | 73/116 |
| 3,577,194 | 5/1971 | Beall | 340/347 AD |
| 3,584,507 | 6/1971 | Hohenberg | 73/116 |
| 3,593,012 | 7/1971 | Lang | 235/150.51 |
| 3,686,484 | 8/1972 | Ciemochowski | 73/116 |
| 3,711,686 | 1/1973 | Apitz | 235/150.24 |
| 3,744,300 | 7/1973 | Fleury | 73/67.3 |
| 3,777,555 | 12/1973 | Petrisko et al. | 73/91 |
| 3,835,305 | 9/1974 | Kus | 235/151.34 |
| 3,841,149 | 10/1974 | Edwin et al. | 235/151.3 |
| 3,878,384 | 4/1975 | Bowker | 235/151.3 |
| 3,898,875 | 8/1975 | Knoop et al. | 73/116 |
| 3,914,996 | 10/1975 | Davis et al. | 235/151.3 |
| 3,979,579 | 9/1976 | Kleinpeter | 235/150.2 |
| 4,031,366 | 6/1977 | Hartung | 235/151.3 |
| 4,419,654 | 12/1983 | Funk | 340/52 R |

FOREIGN PATENT DOCUMENTS 47-39427 10/1972 Japan.

OTHER PUBLICATIONS

Adaptation of the Howell TTRI for J57-P-420 Cumulative LCF Damage Determination, dated Sep. 16, 1971.

Primary Examiner—Bernard Roskoski
Attorney, Agent, or Firm—Price, Heneveld, Huizenga & Cooper

[57] ABSTRACT

An A/D converter includes a limiting circuit for limiting the amplitude of bipolar input signals. A comparator compares the amplitude limited signals with reference voltages and provides pulse output signals corresponding to the duration of each half-cycle of the bipolar signals. The pulse output signals are applied to a counter circuit which counts clock pulses for each of the half-cycle intervals to provide a digital word for each half-cycle of bipolar signal information which accurately indicates the duration of each half-cycle of the input signal. The A/D circuit is employed, in one embodiment of the present invention, with a microprocessor programmed to analyze the engine speed signals from a tachometer according to a prescribed relationship to provide output information useful for predicting when engine maintenance is required.

20 Claims, 3 Drawing Figures

CIRCUIT FOR CONVERTING ANALOG BIPOLAR SIGNALS TO DIGITAL SIGNALS

BACKGROUND OF THE INVENTION

The present invention relates to an electrical circuit and particularly one for converting bipolar analog signals to a digital format.

In the processing of analog information from sensors, frequently, the analog signal is a bipolar signal having an asymmetric waveform. Signals, for example, from tachometers employed in jet aircraft engine monitoring systems typically will provide a generally AC waveform in which each half-cycle of bipolar signal may vary in duration such that the positive half-cycle may be longer or shorter than the negative half-cycle. Also, the wave shape typically can be irregular and in addition, contain noise frequency components. Although these signals are adequate for providing a visual display of the general engine speed, the signals lack the accuracy to be processed by conventional circuits for providing extremely accurate engine speed information which is necessary in certain applications.

One such application of engine speed is the utilization of such information to determine when engine maintenance is required. Thus, for example, in the General Electric J85 turbine engine, periodic maintenance is performed as a function of the use of the engine as measured by the number of engine speed excursions through predetermined zones of engine r.p.m.'s. In order to accurately provide engine r.p.m. information which can be employed to provide engine maintenance information, it is desirable, therefore, to supply accurate data as to the engine speed.

This application of engine r.p.m. signal information for predicting engine life maintenance is described in a Pratt & Whitney Aircraft document dated Sept. 16, 1971, entitled Adaptation of the Howell TTRI for J57-P-420 Cumulative LCF Damage Determination and is also described in U.S. Pat. No. 4,031,366 which also describes a hard wired logic signal processing system coupled to an r.p.m. generator. The conversion of the periodic waveforms provided by the tachometer disclosed is an AC to DC converter by which a DC level is provided directly from the AC signal voltage.

Another technique for processing tachometer signals is to simply count the tachometer pulses during a prescribed time period to determine r.p.m. information. Also, AC tachometer signals have been converted to DC through a frequency to voltage conversion circuit as suggested in U.S. Pat. Nos. 3,750,465; 3,686,484 and 3,584,507. An inherent deficiency in such systems is that the signal information can vary rapidly with time, and an error can result due to the relatively slow response of the frequency to voltage conversion circuitry.

SUMMARY OF THE PRESENT INVENTION

The system of the present invention overcomes the deficiencies of the prior art by providing an A to D converter which includes a limiting circuit for limiting the amplitude of signals from a tachometer, comparing the amplitude limited signals with reference voltages and providing pulse output signals corresponding to the duration of each half-cycle of the bipolar signals provided. The pulse output signals are applied to a counter circuit which counts clock pulses for each of the half-cycle intervals to provide a digital word for each half-cycle of bipolar signal information which accurately indicates the duration of each half-cycle of the input signal. This circuit is employed, in one embodiment of the present invention, in connection with a microprocessor which is programmed to analyze the engine speed information contained therein according to a prescribed relationship to provide output information useful for predicting when engine maintenance is required.

The system of the present invention, therefore, provides a digital format signal which is an extremely accurate representation of the frequency and/or period information contained by a bipolar varying analog signal which digital format information can be employed by a microprocessor for subsequent analysis. According to one embodiment of the present invention, an engine monitor circuit incorporates an analog-to-digital converter in which analog tachometer signals are converted to digital words representative of each half-cycle of input information and processed by a microprocessor to provide output signals representative of engine use.

These and other features, objects and advantages of the present invention will become apparent upon reading the following description thereof together with reference to the accompanying drawings in which:

DETAILED DESCRIPTION OF THE PREFERRED EMBODIMENT

Figure 1:
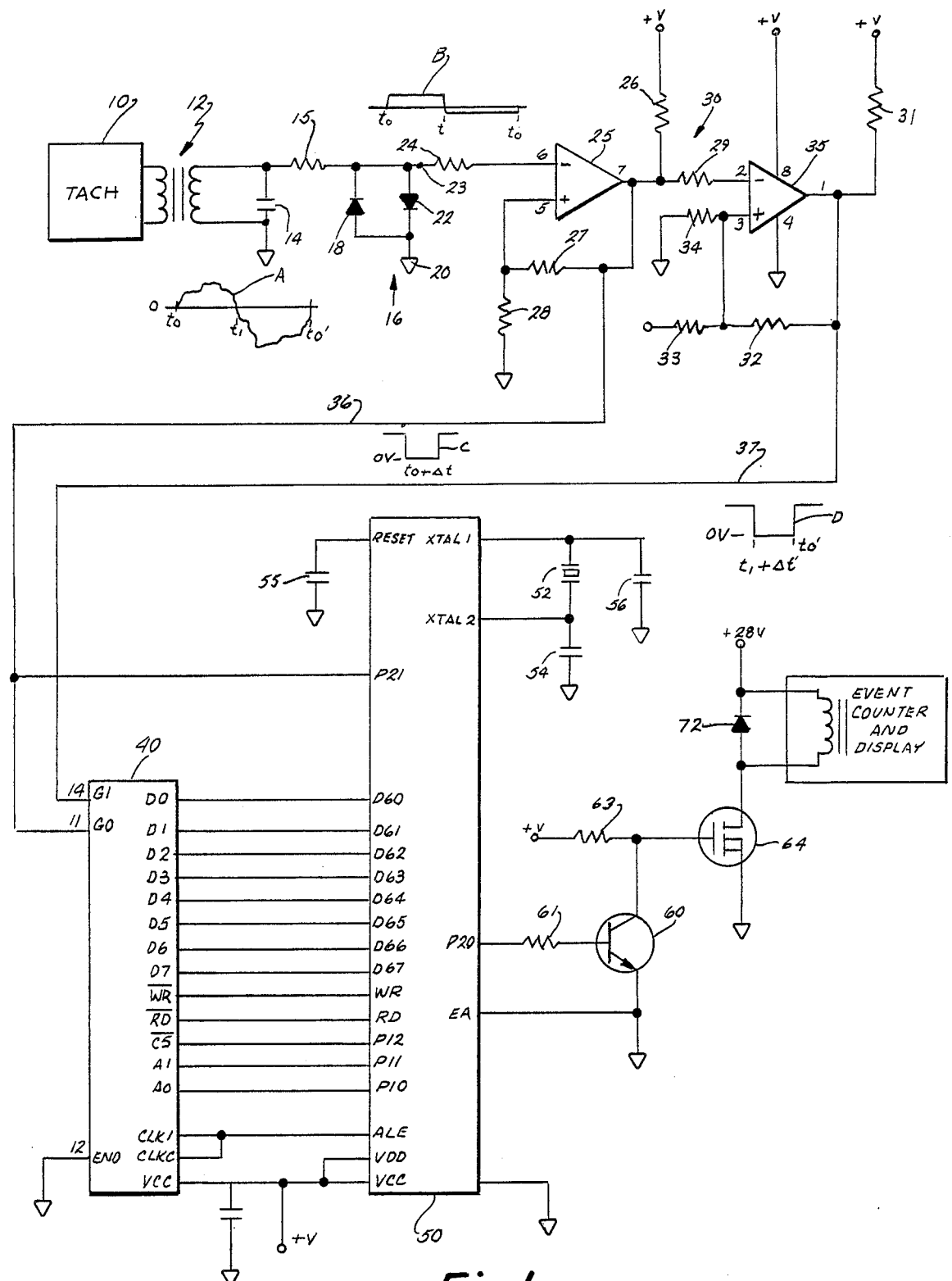
FIG. 1 is an electrical circuit diagram in schematic form of the system embodying the present invention.

Referring initially to FIG. 1, there is shown a circuit embodying the present invention. The analog-to-digital (A/D) converter circuit employed for processing the analog signals and in one embodiment, bipolar varying periodic signals are shown in the environment of a jet engine monitoring system in which a commercially available engine speed tachometer 10 provides input signals through means for supplying such signals including an AC coupling transformer 12 having a 1:1 winding ratio. Coupled across its secondary winding is a filter capacitor 14 which forms in conjunction with the secondary winding of transformer 12 and coupling resistor 15, a low pass filter substantially filtering out frequencies above 1 kHz to remove noise component information from the waveform signal A, shown below the filter, which represents the signals from tachometer 10. The tachometer 10 is an AC generator which is gear coupled to the engine and has operating speeds between 0 and 4,200 r.p.m. to provide a bipolar varying periodic output analog signal having a frequency range of from 20 to 70 Hz which represents the entire range of engine speed operation. The relatively narrow 50 Hz range signals represented by waveform A thus contains r.p.m. information for an engine speed whose speed varies from 0 to approximately 30,000 r.p.m. for a J-85 engine. Each cycle of relatively low frequency signal information therefore can represent a significant number of engine revolutions and must be accurately processed. The waveform A is divided into a positive half-cycle from $t_0$ to $t_1$ and a second, negative half-cycle from $t_1$ to $t_0'$ for each operating cycle, and as illustrated by waveform A, the time $t_0$ to $t_1$ is significantly shorter than the second half-cycle from $t_1$ to $t_0'$. Waveform A is merely illustrative to indicate the bipolar waveform may have an asymmetric shape and two periods and thus, although periodic in the sense that the signals are bipolar, are not necessarily symmetrical and certainly not sinusiodal. The filtered waveform A is applied to a limiter circuit 16 through an input series coupled resistor 15.

Limiter circuit 16 includes a Schottky diode 18 having its cathode coupled to resistor 15 and its anode coupled to system ground 20. A second diode 22, coupled in parallel with diode 18, has its anode coupled to the cathode of diode 18 and its cathode coupled to the anode of diode 18. Diode 22 is a conventional silicon diode. Signals applied to limiter circuit 16 are thus amplitude limited in the positive half-cycle by the forward conductivity of diode 22 at a $1V_{be}$ level which is approximately 0.7 volts for a silicon diode during the time period $t_0$ to $t_1$. During the negative half-cycle of each cycle of input signal, the Schottky diode 18 conducts at a voltage of approximately 0.15 volts to provide an asymmetric amplitude waveform B at output terminal 23 of limiter circuit 16. The purpose of providing the asymmetric waveform is to provide a limited negative going input signal to the comparator circuit 30, and in particular, to negative input terminal 6 of the first comparator 25 associated with comparator circuit 30. The signal waveform B thus has an amplitude of approximately 0.7 volts from time $t_0$ to $t_1$ and approximately $-0.15$ volts from $t_1$ to $t_0'$.

Signal waveform B is applied to comparator circuit 30 through series coupled resistor 24 and comprises a pair of operational amplifiers 25 and 35 included on a single integrated circuit chip, Model No. LM193, available from National Semiconductor, and coupled as comparators. Amplifier 25 has its positive input terminal 5 biased by a first reference voltage source at 49 millivolts, in the preferred embodiment of the invention. The first reference voltage source includes a voltage divider circuit from the +5 volt (+V) DC supply through resistor 26 having a value of 3.3 kilo-ohms, resistor 27 having a value of 10 megaohms and resistor 28 having a value of 10 kilo-ohms with resistor 27 coupled from output pin 7 to positive input pin 5 and resistor 28 coupled from pin 5 to ground, as shown. Thus, when the waveform B, applied during time period $t_0$ to $t_1$, reaches a level above 49 millivolts, which is approximately less than 1 microsecond after $t_0$, first comparator 25 will switch from a logic "1" output level of approximately 4.9 volts to 0 volts and remain at 0 volt output level until the input signal B falls to below 49 millivolts at time $t_1$. The less than 1 microsecond delay in switching of amplifier 25 is occasioned by the sharp rise time of waveform B with this insignificant delay being indicated in waveform C representing the pulse output signal from comparator at terminal 7 corresponding to the first or positive half-cycle of the bipolar input signal as $\Delta t$. The pulse output signal of the first comparator is indicated by waveform C in the Figure.

The output pin 7 of comparator 25 is coupled to input pin 2 of a second comparator 35 through series coupled resistor 29 while the positive input terminal 3 is coupled to a second reference voltage source including a voltage dividing network including a 3.3 k resistor 31 coupled from +V to output pin 1, a hysteresis feedback resistor 32 having a value of 10 megaohms and coupled from output pin 1 to input pin 3 and a 100 kilo-ohm resistor 33 coupled from +V to input pin 3 which is also coupled to ground through a 10 kilo-ohm resistor 34. This DC biasing arrangement biases pin 3 at approximately 0.45 volts DC such that comparator 35 will provide an output pulse waveform D, shown in FIG. 1, initiated at time $t_1 + \Delta t'$ corresponding to less than 1 microsecond after $t_1$ and swing back to a positive level at $t_0'$.

Thus, pulse waveform C is a negative going pulse provided on output line 36 of comparator 30 and occurs for each positive half-cycle of input signals waveform A, while signal waveform D is a negative going pulse applied to output line 37 of comparator 30 and which corresponds to negative swings of the input waveform A. It is noted here that the time delay $\Delta t$, which is less than 1 microsecond, is an insignificant loss of information inasmuch as for the 20 through 70 Hz range of waveform A, the total time period for each cycle of input information is from 14,285 microseconds to 50,000 microseconds, and the loss of 2 microseconds is insignificant. The hysteresis feedback resistors 27 and 32, associated with comparators 25 and 35, prevent oscillation during the switch over points of these circuits by providing a slight amount of offset hysteresis in the switching. The pulses C and D thus occur during each cycle of bipolar input information and have a width which is substantially identical to the width of the positive and negative half-cycle of input signal A which, in turn, is linearly and inversely related to the engine speed. Thus, as the engine to which tachometer 10 is coupled increases its speed, the pulse width of pulses C and D will narrow, and as the speed decreases, the pulses will widen.

Pulses C and D are applied to gate input terminals $G_0$ and $G_1$ of a counter circuit 40 which, in the preferred emobidment, was an Intel 8253 integrated circuit chip. Counter 40 receives 1 megahertz clock input signals at clock terminals 0 and 1 from a microprocessor circuit 50 through its 6 megahertz crystal oscillator including a crystal 52 and bypass capacitors 54 and 56, coupled as shown in FIG. 1. Counter 40 includes three separate, internal counters, however, only two counters are employed, and each counter is gated respectively by a pulse C or D on gate input terminals $G_0$ and $G_1$, respectively. In response to input signals C and D, the counter provides a multiplexed eight bit word at data output terminals $D_0$ through $D_7$, applied to data input terminals $D_{60}$ through $D_{67}$ of microprocessor 50 which comprises a commercially available Intel 8748. Waveform pulse C is also coupled to control input terminal $P_{21}$ of microprocessor 50 for providing timing information thereto. Counter 40 responds to the 1 megahertz clock signals at input terminal $Clk_0$ and $Clk_1$ during time $t_0$ to $t_1$, to sequentially provide two eight bit words to microprocessor 50 providing in effect, therefore, a sixteen bit data word representing the time period $t_0$ to $t_1$ of input signal A. This provides a resolution of approximately 65,536 available identifying words corresponding to this time interval. Similarly, the second counter contained within counter 40 responds to gating signal D to provide a data word comprising two sequential eight bit words from output terminals $D_0$ to $D_7$ representing the time period $t_1$ to $t_0'$ of input signal A. The digital words are applied to microprocessor 50 and are representative of each half-cycle of the bipolar input signals A and of the engine speed during each half-cycle of tachometer detected information. As can be seen with resolution this high and by providing a digital word for each half-cycle of information, extremely accurate engine r.p.m.

information is available and applied to the microprocessor.

The microprocessor 50 is interconnected to counter circut 40, as shown in FIG. 1, and has its reset terminal coupled to ground through capacitor 55. An output terminal $P_{20}$ is coupled to the base of NPN drive transistor 60 through series resistor 61 with the emitter of transistor 60 coupled to ground. The collector of transistor 60 is coupled to +V through resistor 63 and also to the gate terminal of an FET drive transistor 64 having its source coupled to an aircraft's +28 volt supply through an event counter 70 and its drain coupled to ground. A diode 72 bypasses event counter 70 and prevents inductive voltage spikes from injuring transistor 64. The event counter responds to output pulses at $P_{20}$ of microprocessor 50 to provide an electromechanical accumulating counter providing an arbitrary number representative of the engine usage as a function of predetermined r.p.m. excursions, as described in connection with FIGS. 2 and 3 below. This information is used by maintenance personnel to ascertain, according to prescribed schedules, when certain maintenance functions are to be performed on the engine. In some embodiments of the invention, the speed information in the form of sixteen bit data words from counter 40 can be employed, however, to provide remote and extremely accurate engine speed information to operators of the aircraft, and the A/D converter circuit including circuits 16, 30 and 40 can be employed for providing digital words representative of the period between different levels of any analog varying input signal in other environments.

Figure 2:
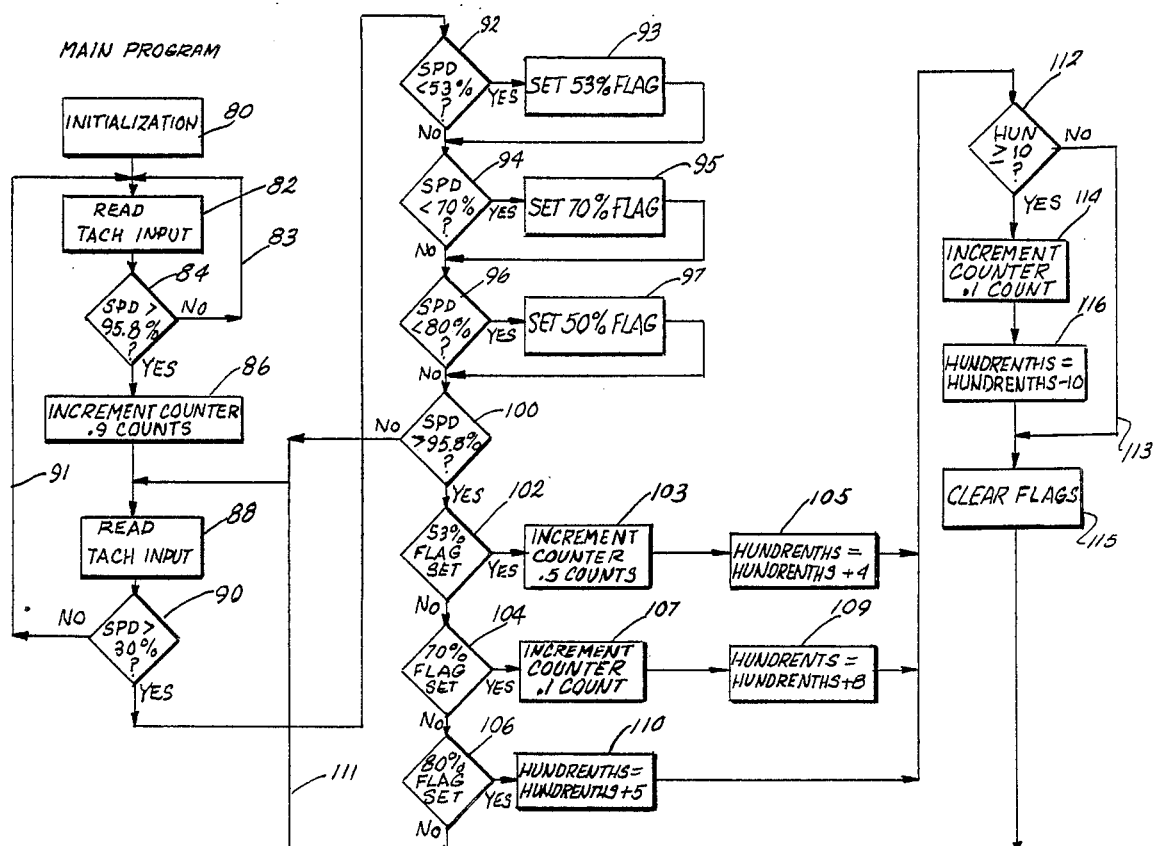
FIG. 2 is a flow diagram for the programming of the microprocessor shown in FIG. 1.
Figure 3:
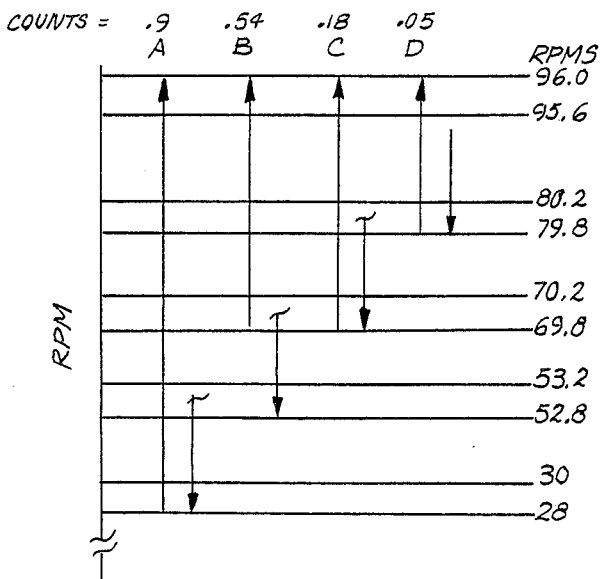
FIG. 3 is a table representing the relationship between engine r.p.m. excursions and engine use scaling information.

Having described the circuit construction and the provision of data words for each half-cycle of input information which assures that if asymmetrical time spans exist for each of the half-cycles, extremely accurate period information is supplied, a description of the application of this A/D converter in the preferred embodiment of the invention follows in connection with FIGS. 2 and 3.

The event counter and display 70 is employed to provide a cumulative count representing various r.p.m. excursions of the engine being monitored. When the count reaches predetermined levels, certain maintenance is performed on the engine according to specifications provided by the engine manufacturer. The counter provides an accumulated count according to the following equation:

Accumulated count = 0.9A + 0.54B + 0.18C + 0.05D

Where the scaling factors (0.9, 0.54, 0.18, and 0.05) are determined according to the well-known application of Miner's Rule and letters A, B, C and D represent integers determining the number of times certain levels of engine r.p.m.'s have been reached. Thus, initially referring to FIG. 3, a count of 0.9 is provided when the engine reaches what is known as military speed which is approximately 95.8% of full power plus or minus 0.2% points. Since this is the most stressful engine condition, a weighted count of 0.9 is provided. If the engine drops to below 30%, it indicates that the engine has been shutoff since this is below idle speed. If the engine speed reduces to approximately 53%, indicating a cycle from full power to significantly lower power and returns to full power, the wear on the engine is less than in the first instance where it went from start up to full power, a smaller scaling factor of 0.54 is employed. Similarly, for engine speeds of approximately 70% of maximum, a scaling factor of 0.18 is employed and for an engine slow down to approximately 80%, a scaling of 0.05 is employed. By continuously monitoring the engine speed at a sampling rate of approximately ten times per second, provided by the chip select command from microprocessor 50 to the counter 40, the engine speed is continuously monitored, and the excursions between the various r.p.m. levels are identified and determined. Use of the engine speed data information by the microprocessor is best illustrated by the flow diagram for the microprocessor program of FIG. 2, now described.

The program is first initialized, as indicated by block 80, and the input signal read, as indicated by block 82. An initial level test is conducted, as indicated by block 84, to determine whether or not the engine speed, as represented by the digital words from counter 40, has reached 95.8%. If it is not, the loop, including block 82, is repeated, as indicated by flow path 83. If engine speed has reached military power, the event counter 70 is incremented by 0.9 counts (A=1), as indicated by block 86. The event counter is a commercially available unit from the Electrodynamics division of Tally Industries and provides unit and tenths counting and display in a digital wheel-type display. Thus, once full power has been reached for the first time, the counter will display 0.9 and in the future, 0.9 in addition to whatever has been previously accumulated.

The tach input is again read, as indicated by block 88, and a test conducted to ascertain whether the speed is above the minimum speed of 30%, as indicated by block 90. If the engine is below 30% and thus, the engine shut down, the loop, including blocks 82 through 88, is repeated, as indicated by line 91. If the engine speed is above 30%, however, a series of additional tests to determine the other engine speed levels are conducted, the first test being at the 53% level, as indicated by block 92. If the speed is less than 53%, indicating a significant slow-down in the engine speed, a 53% flag corresponding to constant B, shown in FIG. 3, is set, as indicated by block 93, and the program next conducts a test, as indicated by block 94, to determine if the speed is below 70%. If the speed was above 53%, initially, no flag is set, and the program proceeds to test 94. If the speed is less than 70%, the 70% flag is set, as indicated by block 95, corresponding to letter C in FIG. 3, and the program returns to the next test at block 96. If the speed was greater than 70%, the program proceeds directly from block 94 to 96 without setting the 70% flag. Finally, the engine speed is tested to ascertain whether it is below 80%, as indicated by block 96, and if it is, the 80% flag corresponding to letter D in FIG. 3 is set, as indicated by block 97. The program then proceeds from either block 96 or 97, depending on the test results, to test whether or not military speed of 95.8% has been reached, as indicated by block 100. If the test is affirmative, and if the engine speed slowed to any one of the speeds indicated by tests 92, 94 and 96, a test is conducted to determine which of the flags were set, as indicated by blocks 102, 104 and 106. If, for example, the engine speed had decreased to 51% and the 53% flag set, the counter is incremented by 0.5 counts, as indicated by block 103, and a hundredths storage register is incremented by 4 counts, as indicated by block 105. This temporary storage of hundredths digits is necessary since the event counter 70 only provides tenths information. Similarly, if the 70% flag had been set, the counter is incremented by 0.1 count, as indicated by block 107, and the hundredths counter incremented by 8 counts, as indicated by block 109. If the 80% flag had been set, the hundredths counter is incremented by 5 counts, as indicated by block 110. If the series of tests 102 through 106 indicate no flags were set, the program returns, as shown by line 111, to the read input tach test 88 and continues cycling through blocks 88, 90, 92, 94, 96 and 100 through 106 if the speed remains above 30% to detect any lowering of engine speed to one of the flag setting levels. The sequence of blocks 102 through 104 assure that only the lowest speed flag set will increment the counter to identify a unique speed excursion, as shown in FIG. 3. Thus, if the speed was reduced to 51%, three flags for 53%, 70% and 80% would be set but only 0.54 counts added to the counter since the program flows from block 102 through blocks 103 and 105 to block 112.

If a flag has been set, as indicated by a "yes" decision on one or more of the blocks 102, 104 or 106, the hundredths counter is checked, and if it has stored more than 10 counts therein, as indicated by test 112, the counter is incremented by 0.1 counts, as indicated by block 114. If the hundredths storage is less than 10, the program proceeds via line 113 to clear all of the set flags, as indicated by block 115, and return to the previously identified loop, as indicated by line 111. If the counter is incremented by 0.1 count, as indicated by block 14, hundredths counts stored in the hundredths register is decremented by 10 counts, as indicated by block 116, since this information is now stored in the event counter and display 70.

Thus, by storing limit information in the microprocessor for the various speed limits and continuously testing the speed input information from counter 40, the microprocessor provides at output terminal $P_{20}$ a pulse corresponding to each tenth of accumulated counts for the event counter and display 70 via the interface circuit including transistors 60 and 64. The event counter and display responds to the tenth information to increment its dial-type digital display on a continuous basis and can be ready by the engine mechanic after each aircraft mission to determine if maintenance is required on the engine.

With the utilization of a microprocessor, tests in addition to the four levels disclosed in the preferred embodiment can be readily provided with the microprocessor having the capability of tests at a large number of discrete speed levels and a relatively high resolution engine wear or use indicating formula can be approximated instead of the four levels shown in FIG. 3. Thus, the engine wear versus engine r.p.m. curve, which is approximated by the four points of the above noted equation can be more accurately approximated by, for example, providing 50 or more tests as to engine speed excursions. The accuracy of this system is further enhanced by the unique A/D converter used which provides the extremely accurate engine speed data through the sampling of each half of the bipolar signal and providing a digital word corresponding to the pulse width during each half of each cycle of analog input information.

It will become apparent to those skilled in the art that various modifications to the preferred embodiment of the invention can be made without departing from the spirit or scope thereof as defined by the appended claims.

The embodiments of the invention in which an exclusive property or privilege is claimed are defined as follows.

1. An analog-to-digital converter circuit for converting bipolar varying period analog signals into a digital format comprising:
    means for supplying bipolar analog input signals;
    limiter circuit means coupled to said supplying means for limiting the amplitude of each polarity of said input signals;
    comparator means coupled to said limiter circuit means and responsive to signals therefrom exceeding first and second reference voltage levels to provide first and second pulse output signals therefrom during a first and a second polarity, respectively, wherein the pulse width of said pulse output signals is substantially equal to the duration of each polarity of each cycle of said input signals; and
    counter circuit means coupled to said comparator means and responsive to said pulse output signals to provide a digital output signal for each polarity of input signal which is representative of the duration of said input signal.

2. The circuit as defined in claim 1 wherein said limiter circuit comprises a diode having a cathode coupled to said supplying means and an anode coupled to ground and a second diode having an anode coupled to said supplying means and a cathode coupled to ground.

3. The circuit as defined in claim 2 wherein said first diode is a Schottky diode.

4. The circuit as defined in claim 1 wherein said comparator means comprises first and second comparator circuits with said first comparator circuit having an output terminal, an input terminal coupled to said limiting means and a reference voltage terminal coupled to a first reference voltage source and said second comparator circuit includes an input terminal coupled to said output terminal of said first comparator and a reference voltage terminal coupled to a second reference voltage source.

5. The circuit as defined in claim 4 wherein the voltage provided by said reference voltage sources is significantly less than the signals applied to said input terminals of said comparators.

6. The circuit as defined in claim 1 wherein said counter circuit means is an interval timer and said digital output signals therefrom comprise multiple bit binary words.

7. A system for providing engine wear indicative information comprising:
    a transducer for providing analog bipolar signals representative of an engine operating parameter;
    limiter circuit means coupled to said transducer for limiting the amplitude of each polarity of said bipolar signals;
    circuit means coupled to said limiter circuit for converting signals therefrom into digital words representing the duration of each polarity of each cycle of said bipolar signals exceeding a predetermined reference level;
    a microprocessor coupled to said circuit means and responsive to said digital words for providing event output signals indicating predetermined engine parameter excursions; and
    counter means coupled to said microprocessor and responsive to said event output signals for accumulating engine parameter excursion information and for displaying such accumulated information.

8. A system for providing engine wear indicative information comprising:
- a transducer for providing analog bipolar input signals representative of an engine operating parameter;
- circuit means for converting said analog signals into digital words representing the duration of each polarity of each cycle of said bipolar signals, wherein said circuit means comprises limiter circuit means coupled to said providing means for limiting the amplitude of each polarity of said input signals, comparator means coupled to said limiter circuit means and responsive to signals therefrom exceeding first and second reference voltage levels to provide first and second pulse output signals therefrom during a first and a second polarity, respectively, wherein the pulse width of said pulse output signals is substantially equal to the duration of each polarity of each cycle of said input signals; and counter circuit means coupled to said comparator means and responsive to said pulse output signals to provide a digital output signal for each polarity of input signal which is representative of the duration of said input signal;
- a microprocessor coupled to said circuit means and responsive to said digital words for providing event output signals indicating predetermined engine parameter excursions; and
- counter means coupled to said microprocessor and responsive to said event output signals for accumulating engine parameter excursion information and for displaying such accumulated information.

9. The circuit as defined in claim 8 wherein said comparator means comprises first and second comparator circuits with said first comparator circuit having an output terminal, an input terminal coupled to said limiting means and a reference voltage terminal coupled to a first reference voltage source and said second comparator circuit includes an input terminal coupled to said output terminal of said first comparator and a reference voltage terminal coupled to a second reference voltage source.

10. The circuit as defined in claim 9 wherein said limiter circuit comprises a diode having a cathode coupled to said supplying means and an anode coupled to ground and a second diode having an anode coupled to said supplying means and a cathode coupled to ground.

11. The circuit as defined in claim 10 wherein said counter circuit means is an interval timer and said digital output signals therefrom comprise multiple bit binary words.

12. The circuit as defined in claim 11 wherein said first diode is a Schottky diode.

13. The circuit as defined in claim 12 wherein the voltage provided by said reference voltage sources is signficantly less than the signals applied to said input terminals of said comparators.

14. An analog-to-digital converter circuit comprising:
- means for supplying analog input signals;
- low pass filter means coupled to said supplying means for filtering out noise frequency signals;
- limiter circuit means coupled to said low pass filter means for clipping input signals therefrom;
- a first comparator circuit means having one input terminal coupled to said limiter circuit means, an output terminal and a reference voltage input terminal;
- a first reference voltage source coupled to said reference voltage terminal of said first comparator whereby said first comparator provided output pulse signals representative of the duration of said analog signal which exceeds said first reference voltage;
- a second comparator circuit means having one input terminal coupled to said limiter circuit means, an output terminal and a reference voltage input terminal; and
- a second reference voltage source coupled to said reference voltage terminal of said second comparator whereby said second comparator provides output pulse signals representative of the duration of said analog signal which exceeds said second reference voltage.

15. The circuit as defined in claim 14 and further including counter circuit means having first and second input terminals coupled to said output terminals of said first and second comparators respectively and responsive to signals therefrom to provide a digital output signal therefrom representing the duration of said analog signals.

16. The circuit as defined in claim 15 wherein said counter circuit means is an interval timer and said digital output signals therefrom comprise multiple bit binary words.

17. The circuit as defined in claim 16 wherein said input signals are bipolar.

18. An analog-to-digital converter circuit for converting varying analog input signals into a digital format comprising:
- means for supplying varying analog input signals;
- comparator means coupled to said supplying means and responsive to signals therefrom exceeding first and second reference voltage levels to provide first and second pulse output signals therefrom during first and second time periods in which the pulse width of said pulse output signals is substantially equal to the duration of said input signals exceeding said first and second reference voltage levels respectively; and
- counter circuit means coupled to said comparator means and responsive to said pulse output signals to provide a digital output signal for each polarity of input signal which is representative of the duration of said input signal.

19. The circuit as defined in claim 18 wherein said counter circuit means is an interval timer and said digital output signals therefrom comprise multiple bit binary words.

20. The circuit as defined in claim 19 wherein said comparator means comprises first and second comparator circuits with said first comparator circuit having an output terminal, an input terminal coupled to said limiting means and a reference voltage terminal coupled to a first reference voltage source and said second comparator circuit includes an input terminal coupled to said output terminal of said first comparator and a reference voltage terminal coupled to a second reference voltage source.

* * * * *

UNITED STATES PATENT AND TRADEMARK OFFICE
CERTIFICATE OF CORRECTION

PATENT NO. : 4,580,127

DATED : April 1, 1986

INVENTOR(S) : Michael G. Blowers

It is certified that error appears in the above—identified patent and that said Letters Patent are hereby corrected as shown below:

Column 7, line 42:
    "ready" should be --read--;

Column 10, line 5, claim 14:
    "provided" should be --provides--.

Signed and Sealed this

Twenty-first Day of October, 1986

[SEAL]

*Attest:*

DONALD J. QUIGG

*Attesting Officer*      *Commissioner of Patents and Trademarks*